(12) United States Patent
Reisch et al.

(10) Patent No.: US 11,204,093 B2
(45) Date of Patent: Dec. 21, 2021

(54) ELECTRONIC MODULE, ACTUATOR DEVICE, AND METHOD FOR PRODUCING AN ACTUATOR DEVICE

(71) Applicant: ZF Friedrichshafen AG, Friedrichshafen (DE)

(72) Inventors: Matthias Reisch, Ravensburg (DE); Michael Arnegger, Grünkraut (DE); Jürgen Wafzig, Bermatingen (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 13 days.

(21) Appl. No.: 16/628,416

(22) PCT Filed: Jun. 6, 2018

(86) PCT No.: PCT/EP2018/064808
§ 371 (c)(1),
(2) Date: Jan. 3, 2020

(87) PCT Pub. No.: WO2019/007612
PCT Pub. Date: Jan. 10, 2019

(65) Prior Publication Data
US 2020/0158231 A1 May 21, 2020

(30) Foreign Application Priority Data
Jul. 6, 2017 (DE) .................... 10 2017 211 578.5

(51) Int. Cl.
*H02K 11/00* (2016.01)
*F16H 61/00* (2006.01)
(Continued)

(52) U.S. Cl.
CPC ....... *F16H 61/0006* (2013.01); *F16H 63/304* (2013.01); *H05K 1/189* (2013.01);
(Continued)

(58) Field of Classification Search
CPC .............. F16H 61/0006; F16H 63/304; F16H 2063/3063; F16H 2708/22; F16H 61/0003;
(Continued)

(56) References Cited

U.S. PATENT DOCUMENTS 5,737,188 A * 4/1998 Flierl .................. B60R 16/0239
361/715
5,877,545 A 3/1999 Prince et al.
(Continued)

FOREIGN PATENT DOCUMENTS

DE 19907949 A1 9/2000
DE 10010636 A1 9/2001
(Continued)

OTHER PUBLICATIONS

International Search Report (English Translation) PCT/EP2018/064808, dated Aug. 17, 2018. (3 pages).
(Continued)

*Primary Examiner* — Yuriy Semenenko
(74) *Attorney, Agent, or Firm* — Dority & Manning, P.A.

(57) ABSTRACT

An electronic module (1) includes a first electronic submodule (2) and at least one further electronic submodule (3, 4). The first electronic submodule (2) and the at least one further electronic submodule (3, 4) are electrically conductively connected to each other with an electrical conductor (5, 6), which is reversibly deformable, at least in sections. The first electronic submodule (2), the at least one further electronic submodule (3, 4), and the electrical conductor (5, 6) are encased in a fluid-tight manner with a casing (15), which is reversibly deformable, at least in sections. An actuator device includes at least one mechanical module and the electronic module (1). A method for manufacturing such an actuator device is also provided.

12 Claims, 3 Drawing Sheets

(51) Int. Cl.
*F16H 63/30* (2006.01)
*H05K 1/18* (2006.01)
*H05K 5/02* (2006.01)
*H05K 7/14* (2006.01)

(52) U.S. Cl.
CPC ......... *H05K 5/0204* (2013.01); *H05K 5/0247* (2013.01); *H05K 7/1427* (2013.01); *F16H 2063/3063* (2013.01); *F16H 2708/22* (2013.01); *H05K 2201/0355* (2013.01); *H05K 2201/1009* (2013.01); *H05K 2201/10151* (2013.01)

(58) Field of Classification Search
CPC .... H05K 1/189; H05K 5/0204; H05K 5/0247; H05K 7/1427; H05K 2201/0355; H05K 2201/1009; H05K 2201/10151; H05K 3/284; H05K 2203/1316
See application file for complete search history.

(56) References Cited

U.S. PATENT DOCUMENTS

| | | | |
|---|---|---|---|
| 6,570,773 B1 | 5/2003 | Loibl et al. | |
| 8,245,589 B2 | 8/2012 | Mohr et al. | |
| 9,367,712 B1 | 6/2016 | Smith et al. | |
| 9,408,291 B2 | 8/2016 | Ott | |
| 9,748,040 B2 | 8/2017 | Reisch et al. | |
| 2003/0090221 A1* | 5/2003 | Becker | F16H 59/70 318/400.01 |
| 2004/0045736 A1* | 3/2004 | Jungbauer | H05K 5/0082 174/250 |
| 2010/0191427 A1* | 7/2010 | Brammer | F16H 61/0006 701/51 |
| 2011/0193430 A1* | 8/2011 | Takada | H02K 5/08 310/43 |
| 2014/0239737 A1* | 8/2014 | Reisch | H01F 38/18 307/104 |
| 2015/0002753 A1* | 1/2015 | Perrault | H05K 13/00 349/12 |
| 2015/0331087 A1* | 11/2015 | Philipp | G01S 7/02 342/175 |
| 2017/0367200 A1* | 12/2017 | Albert | H05K 5/065 |

FOREIGN PATENT DOCUMENTS

| | | | |
|---|---|---|---|
| DE | 10110948 A1 | 9/2002 | |
| DE | 102006049274 A1 | 4/2008 | |
| DE | 102010062653 A1 | 6/2012 | |
| DE | 102011084585 A1 | 4/2013 | |
| DE | 102015209191 A1 | 8/2016 | |
| EP | 0740365 A2 | 10/1996 | |
| EP | 0797381 A2 * | 9/1997 | ........... H05K 5/0095 |
| EP | 0797381 A2 | 9/1997 | |

OTHER PUBLICATIONS

German Search Report DE102017211578.5, dated Mar. 12, 2018. (12 pages).

* cited by examiner

ELECTRONIC MODULE, ACTUATOR DEVICE, AND METHOD FOR PRODUCING AN ACTUATOR DEVICE

CROSS-REFERENCE TO RELATED APPLICATIONS

The present application is related and has right of priority to International Patent Application No. PCT/EP2018/064808 filed on Jun. 6, 2018 and also has right of priority to German Patent Application No. 10 2017 211 578.5 filed on Jul. 6, 2017, both of which are incorporated by reference in their entirety for all purposes.

FIELD OF THE INVENTION

The invention relates generally to an electronic module that includes a first electronic submodule and at least one further electronic submodule. The invention also relates generally to an actuator device that includes at least one mechanical module. The invention also relates generally to a method for manufacturing an actuator device.

BACKGROUND

DE 10 2011 084 585 A1 describes an electronic control unit for the open-loop control of at least one rotatably arranged actuator, including electronic components, such as a device for the contactless reception of electrical energy and for the contactless reception of signals, a device for generating magnetic fields, and a common housing, which encloses and accommodates the electronic components. The control unit is designed to be rotatable and to be mounted on or in a component rotating about an axis of rotation.

DE 10 2006 049 274 A1 describes a device for actuating a component rotatably mounted on a shaft, preferably an idler gear of a transmission device, which component is transferrable, with the aid of at least one engagement device including an electric actuator, into an engaged condition, in which the component is rotationally fixed to the shaft. The component can be acted upon, from the interior of the shaft, with the actuation force necessary for engagement or disengagement, in the case of which the at least one electric actuator is at least partially arranged in the interior of the shaft.

SUMMARY OF THE INVENTION

Example aspects of the invention constructionally and/or functionally improve an electronic module. Example aspects of the invention also constructionally and/or functionally improve an actuator device. Example aspects of the invention also improve a method for manufacturing an actuator device.

The electronic module can be utilized for controlling and/or energizing at least one actuator. An electronic submodule can be associated with an actuator. An electronic submodule is utilizable for controlling and/or energizing an actuator. An electronic submodule can be associated with an energy transmission device. An electronic submodule can include at least one electronic component, at least one ferrite core, at least one sensor, and/or at least one printed circuit plate or board (PCB). The at least one electronic component can be a power electronics component. The at least one electronic component can be a signal electronics component. The at least one electronic component can be a coil. An electronic submodule can include a ferrite core. An electronic submodule can include an electronic circuit. The electronic circuit can be a power electronics circuit. The electronic circuit can be a signal electronics circuit. The at least one sensor can be an angle sensor. An electronic submodule can include a stator of an electric machine. An electronic submodule can include an electromagnet.

The electrical conductor can include at least one lead, at least one cable, at least one foil, and/or at least one stamped grid. The at least one lead can comprise include wires or stranded wires. The electrical conductor can include multiple leads. The leads can be insulated with respect to one another. The at least one lead, the at least one cable, the at least one foil, and/or the at least one stamped grid can be reversibly deformable. The at least one lead, the at least one cable, the at least one foil, and/or the at least one stamped grid can be flexible. In the present case, "flexible" means, in particular, "bendable". A flexibility can be elastic or plastic.

The first electronic submodule, the at least one further electronic submodule, and the electrical conductor can be encased in such a way as to be closed all over or entirely closed. The casing can be oil-tight. The casing can be oil-resistant. The casing can be inductively transparent, at least in sections or partially. The casing can be magnetically transparent, at least in sections or partially. In the present case, "transparent" can refer to an at least approximately complete transparency or a partial transparency. The casing can be designed as a housing, a casting/potting, or a coating. The casing can be a polymeric coating. The casing can be Parylene. The casing can include nanoparticles. The casing can be applied in a plasma-assisted process.

The casing can include at least one holding fixture for a mechanical module. The at least one holding fixture can include a centering. The at least one holding fixture can include a centering pin.

The actuator device can be utilized for actuating at least one shift element of a transmission. The transmission can be a manual transmission. The transmission can be a vehicle transmission. The transmission can be a motor vehicle transmission. The at least one shift element can be shiftable between a disengaged shift position and an engaged shift position. The at least one shift element can be utilized for engaging an idler gear with a shaft. The actuator device can be utilized for arrangement within a hollow shaft.

The actuator device can include at least one actuator. The at least one actuator can include an electric machine. The electric machine can be operable as a motor. The electric machine can include a stator and a rotor. The at least one actuator can include a gear. The gear can be utilized for converting a rotary motion into a translatory motion. The gear can include a spindle drive. The spindle drive can include a spindle rod and a spindle nut. The spindle rod or the spindle nut can be rotationally fixed to the rotor. The at least one actuator can include an electromagnet. The electromagnet can include a coil. The electromagnet can include a ferrite core.

The at least one mechanical module can include a rotor of an electric machine. The at least one mechanical module can include at least one bearing. The at least one bearing can be an antifriction bearing or a plain bearing. The at least one mechanical module can include a gear. The at least one mechanical module can include a spindle rod of a spindle drive. The at least one mechanical module can include a spindle nut of a spindle drive. The at least one mechanical module can include a spring device. The at least one mechanical module can include a solenoid valve.

The actuator device can include a load-bearing housing. The housing can be utilized for absorbing axial loads In this context, "axial" refers to an extension direction of a longitudinal axis of the actuator device. The housing can be utilized for unloading or relieving the electronic module. The housing can have a sleeve-like shape.

The electronic module can be elastically or plastically deformed—at the electrical conductor, which is reversibly deformable, at least in sections or partially—into a mounting shape or can be made available in the mounting shape. In the mounting shape, a holding fixture of the casing for accommodating a mechanical module can be accessible. The electronic module can be elastically or plastically deformed into an operating shape at the electrical conductor, which is reversibly deformable, at least in sections or partially. In the operating shape, the actuator device can be operated after its completion. Thereafter, the electronic module, together with the at least one mechanical module, can be arranged in the load-bearing housing. The electronic module, together with the at least one mechanical module, can be inserted into the housing. The electronic module, together with the at least one mechanical module, can be fixed in the housing.

The term "can" refers, in particular, to optional features of the invention. Accordingly, there is an exemplary embodiment of the invention in each case, which includes the particular feature or the particular features.

In summary and expressed in other words, the invention therefore yields, inter alia, an oil-tight, flexible electronics housing. An electronic assembly made up of electronic components is provided with a casing, which encloses all over in an oil-tight manner and includes a flexible area, which, in deviation from the final installation position, allows for a mounting condition to enable completion with further components. For example, an actuator module for actuating two shift positions of a transmission shaft for the form-locking connection of idler gears with respect to a shaft or each other can include such an electronics housing. The actuator module can be utilized for arrangement within a transmission shaft.

The actuator device can form an actuator unit. Such an actuator unit can include: an electronic assembly; and at least one mechanical component. The electronic assembly can include: electronic components; and a casing, which encloses the electronic components all over in an oil-tight manner, such as a housing, a casting, or a coating, for example, a polymeric coating, in particular Parylene or a nano- or plasma coating. A power supply to the electronic assembly can take place inductively through the oil-tight casing. A power output from the electronic assembly to movable mechanical components can take place magnetically through the oil-tight casing. The electronic assembly can be locally reversibly elastically or plastically deformable in such a way that, due to this deformation, at least one mechanical component can be brought into an operative connection with the electronic assembly.

The mechanical component can include a rotor of an electric machine. A mounting of the rotor can be at least partially centered in the electronic assembly. The mechanical component can include an armature of an electromagnet, for example, for actuating a solenoid valve. The electronic components can include one or more of the following components: stator of an electric machine; power electronics; sensor for detecting an angular position of a rotor, such as a Hall sensor; a signal-processing electronics unit; coil for inductively transmitting energy; and/or ferrite core. The electronic assembly can include, in a deformable area of the electronic assembly, flexible or bendable electrical leads, for example, a flexible printed circuit plate or board, flexible foil, or a cable connection or a stamped grid. The oil-tight casing can include a centering for the mechanical component, such as bearing seats of the rotor, in order to keep the tolerance chain short and, therefore, to allow for a small air gap diameter between the stator and the rotor of the electric machine. A load-bearing housing can enclose the actuator unit and absorb axial loads from the mechanical component in such a way that the axial loads are not directed across the electronic assembly.

A manufacture of an actuator device is simplified with the aid of the invention. An arrangement of at least one mechanical module on an electronic module is simplified. Outlay, such as design complexity, time, and/or costs, is reduced. Space required for mounting and/or installation is reduced. A dependence on installation space-related peripheral conditions is reduced.

BRIEF DESCRIPTION OF THE DRAWINGS

Exemplary embodiments of the invention are described in greater detail in the following with reference to figures. Further features and advantages arise from this description. Specific features of these exemplary embodiments can represent general features of the invention. Features of these exemplary embodiments associated with other features can also represent individual features of the invention.

In the drawings, diagrammatically and by way of example.

DETAILED DESCRIPTION

Figure 1:
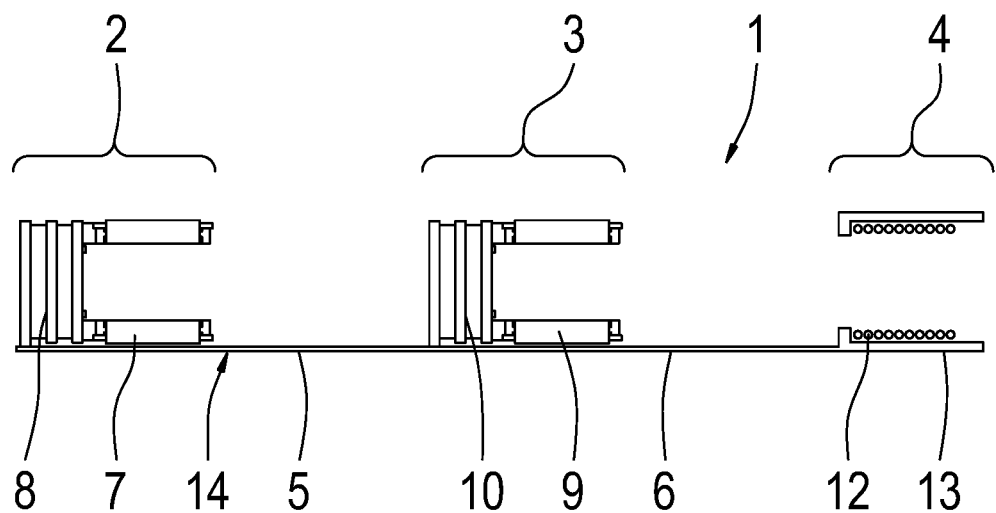
FIG. 1 shows an electronic module including electronic submodules and reversibly deformable electrical conductors.

Reference will now be made to embodiments of the invention, one or more examples of which are shown in the drawings. Each embodiment is provided by way of explanation of the invention, and not as a limitation of the invention. For example, features illustrated or described as part of one embodiment can be combined with another embodiment to yield still another embodiment. It is intended that the present invention include these and other modifications and variations to the embodiments described herein.

FIG. 1 shows an electronic module 1 including electronic submodules 2, 3, 4 and reversibly or elastically deformable electrical conductors 5, 6. The electronic submodule 2 includes a stator 7 of an electric machine and an electronics unit 8 for controlling and/or energizing the electric machine. The electronic submodule 3 includes a stator 9 of an electric machine and an electronics unit 10 for controlling and/or energizing the electric machine. The electronic submodule 4 comprises a coil 12 and a ferrite core 13. The reversibly deformable electrical conductor 5 electrically conductively connects the electronic submodule 2 and the electronic submodule 3 to each other. The reversibly deformable electrical conductor 6 electrically conductively connects the electronic submodule 3 and the electronic submodule 4 to each other. In the present case, the electrical conductors 5, 6 are constructionally and functionally combined and are designed as a flexible printed circuit plate or board 14.

Figure 2:
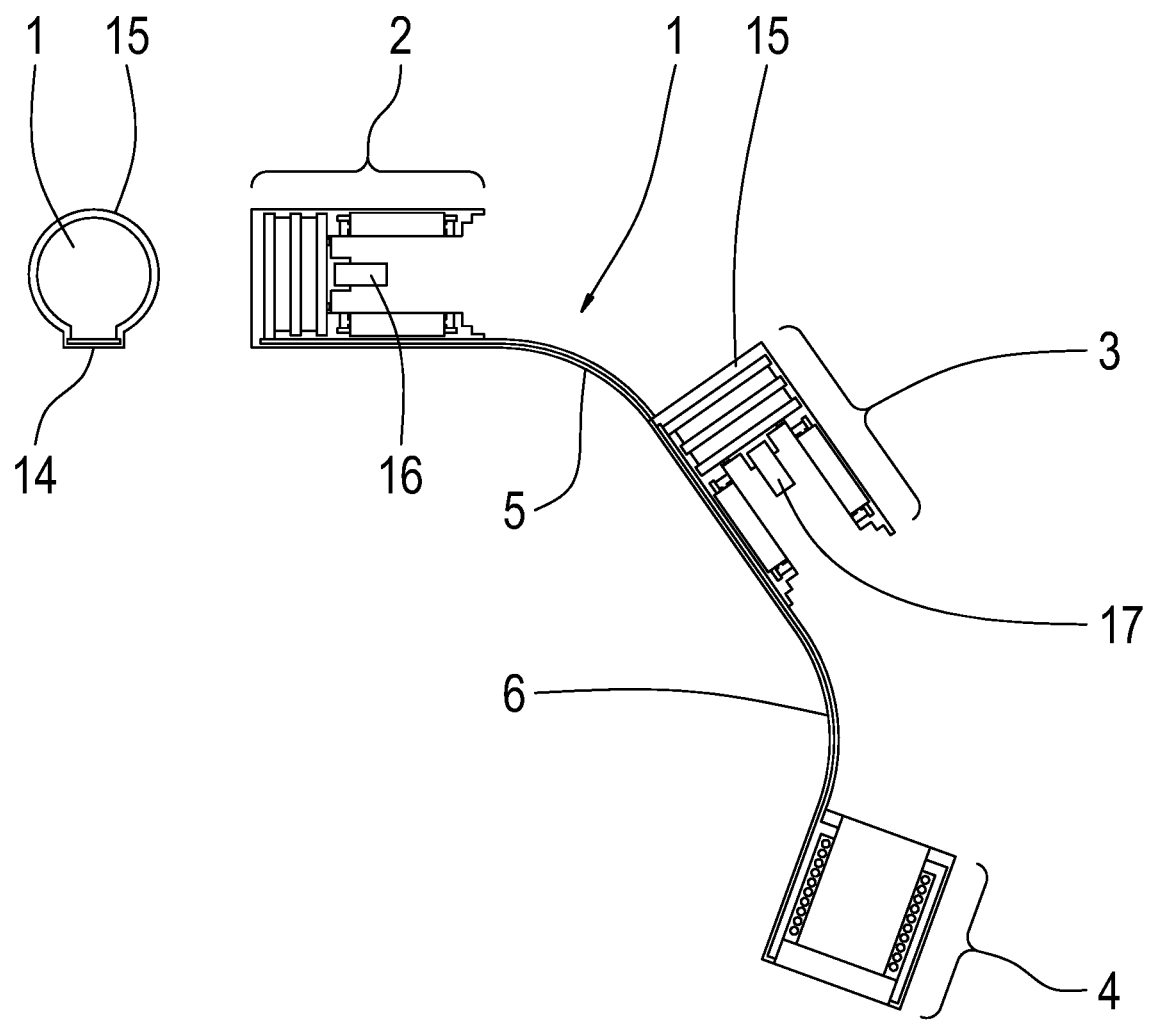
FIG. 2 shows an electronic module including electronic submodules, reversibly deformable electrical conductors, and a reversibly deformable casing.

FIG. 2 shows the electronic module 1 including a casing 15 in the cross-section and in the longitudinal section. The casing 15 is reversibly deformable, in particular, at the electrical conductors 5, 6. The casing 15 encloses the electronic module 1 preferably all over or entirely. The casing 15 is oil-tight and oil-resistant. The casing 15 is inductively and magnetically transparent. The casing 15 includes holding fixtures 16, 17 for mechanical modules. The holding fixtures 16, 17 are designed as metallic centering pins.

As shown in FIG. 2, the electronic module 1, including the casing 15, is deformable at the electrical conductors 5, 6 in such a way that the electronic submodules 2, 3, 4 can be displaced relative to one another. For the rest, reference is additionally made, in particular, to FIG. 1 and the associated description.

Figure 3:
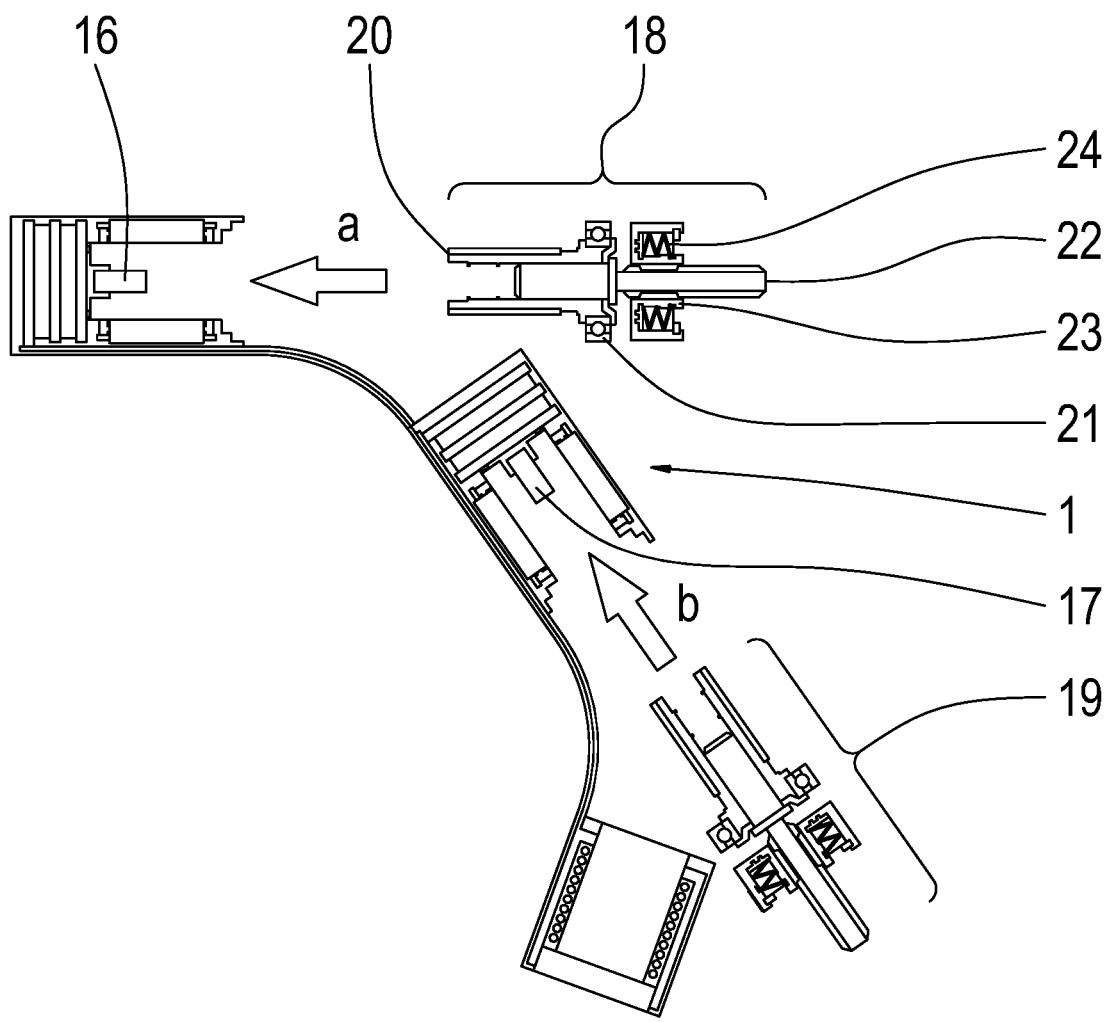
FIG. 3 shows a mounting of mechanical modules on an electronic module.

FIG. 3 shows a mounting of mechanical modules 18, 19 on the electronic module 1. The mechanical modules 18, 19 each include a rotor 20 of an electric machine, a bearing 21, a spindle rod 22, a spindle nut 23, and a spring device 24. The bearing 21 is utilized for the rotatable support of the rotor 20 and is designed, in the present case, as a ball bearing. The spindle rod 22 is fixedly connected to the rotor 20 and includes an external thread. The spindle nut 23 includes an internal thread and is guided with the aid of an internal thread of the spindle nut 23 on the external thread of the piston rod 22. The spring device 24 is arranged radially on the outside of the spindle nut 23 and includes a set of plate springs or disk springs as well as an output part.

In order to mount the mechanical modules 18, 19 on the electronic module 1, the electronic module 1, including the casing 15, is deformed at the electrical conductors 5, 6 into a mounting shape or is made available in the mounting shape in such a way that the mechanical module 18 can be inserted into the electronic submodule 2 according to the arrow direction a and the mechanical module 19 can be inserted into the electronic submodule 3 according to the arrow direction b. In so doing, a rotor 20 is accommodated on a particular holding fixture 16, 17 in a centered manner. For the rest, reference is additionally made, in particular, to FIG. 1 and FIG. 2 and the associated description.

Figure 4:
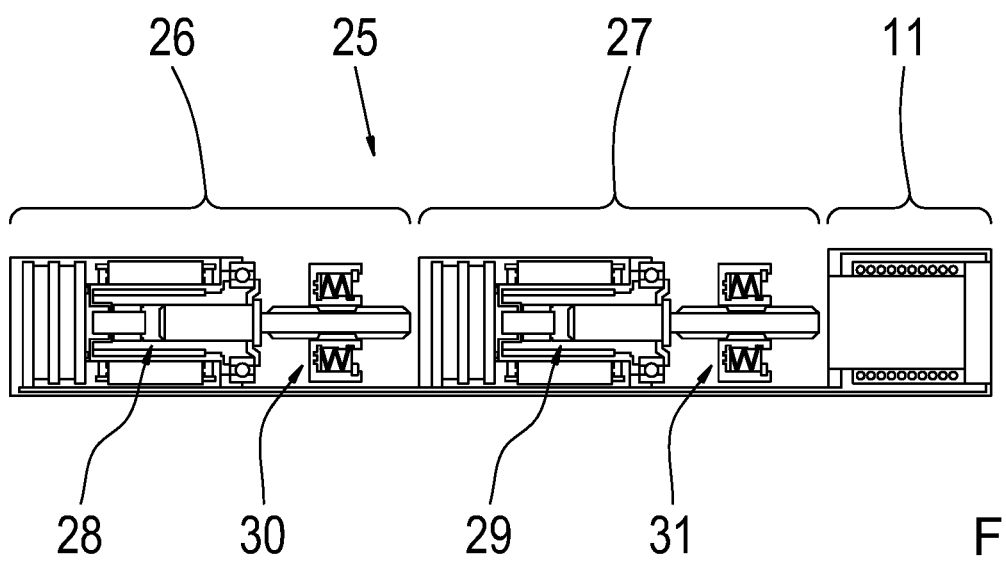
FIG. 4 shows an actuator device including an electronic module and mechanical modules.

FIG. 4 shows an actuator device 25 including the electronic module 1 and the mechanical modules 18, 19. The actuator device 25 is utilized for actuating two shift elements of a shiftable transmission, in particular of a motor vehicle transmission. The actuator device 25 is utilized for the arrangement within a hollow shaft of the transmission.

The actuator device 25 includes actuators 26, 27 and an inductive rotary transmitter 11, which is formed with the aid of the coil 12 and a ferrite core 13. The actuators 26, 27 include an electric machine 28, 29, respectively, which is operable as a motor and is formed with the aid of a stator 7 and a rotor 20, and a gear 30, 31 for converting a rotary motion into a translatory motion, which is formed with the aid of a spindle rod 22 and a spindle nut 23. The electronic units 8, 9 are utilized for controlling and/or energizing the electric machines 28, 29, respectively.

After the mechanical modules 18, 19 have been mounted on the electronic module 1, the electronic module 1, including the casing 15, is deformed at the electrical conductors 5, 6 into the operating shape shown in FIG. 4, in which the conductors 5, 6 are aligned along a straight line. For the rest, reference is additionally made, in particular, to FIG. 1 through FIG. 3 and the associated description.

Figure 5:
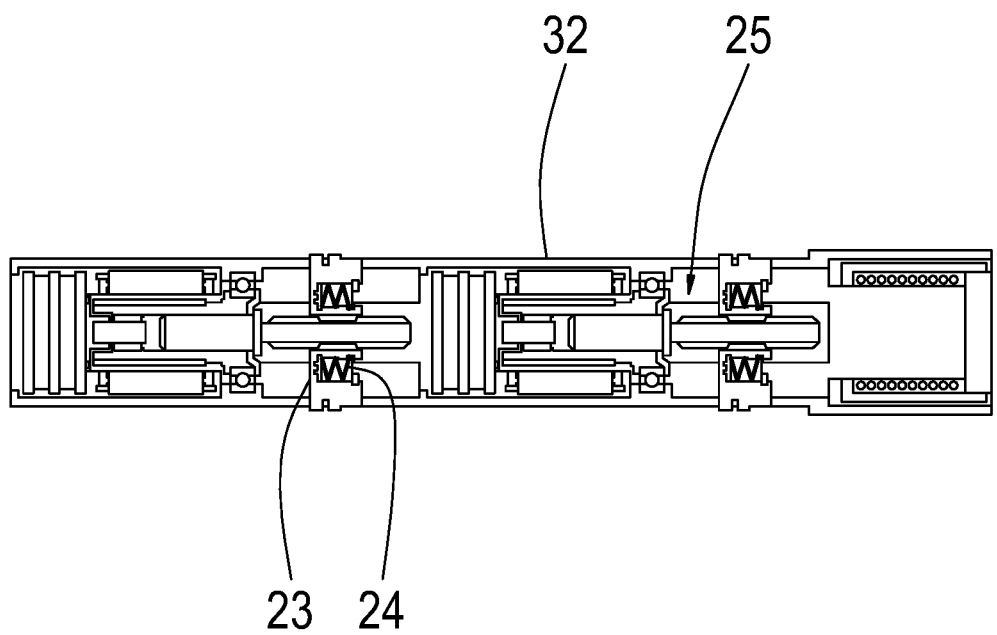
FIG. 5 shows an actuator device including an electronic module, mechanical modules, and a load-bearing housing.

FIG. 5 shows the actuator device 25 including the electronic module 1, the mechanical modules 18, 19, and a load-bearing housing 32. The housing 32 is utilized for absorbing axial loads, so that the electronic module 1 is unloaded. The housing 32 has a sleeve-like shape. The electronic module 1 is arranged radially within the housing 32. The spindle nuts 23 and the spring devices 24 of the mechanical modules 18, 19 are guided in the housing 32 in a rotationally fixed and axially displaceable manner. The output parts of the spring devices 23 are extended out of the housing 32, radially toward the outside, for connection to a shift element. For the rest, reference is additionally made, in particular, to FIG. 1 through FIG. 4 and the associated description.

Modifications and variations can be made to the embodiments illustrated or described herein without departing from the scope and spirit of the invention as set forth in the appended claims. In the claims, reference characters corresponding to elements recited in the detailed description and the drawings may be recited. Such reference characters are enclosed within parentheses and are provided as an aid for reference to example embodiments described in the detailed description and the drawings. Such reference characters are provided for convenience only and have no effect on the scope of the claims. In particular, such reference characters are not intended to limit the claims to the particular example embodiments described in the detailed description and the drawings.

REFERENCE NUMBERS

1 electronic module
2 electronic submodule
3 electronic submodule
4 electronic submodule
5 electrical conductor
6 electrical conductor
7 stator
8 electronics unit
9 stator
10 electronics unit
11 rotary transmitter
12 coil
13 ferrite core
14 printed circuit plate
15 casing
16 holding fixture
17 holding fixture
18 mechanical module
19 mechanical module
20 rotor
21 bearing
22 spindle rod
23 spindle nut
24 spring device
25 actuator device
26 actuator
27 actuator
28 electric machine
29 electric machine
30 gear
31 gear
32 housing

The invention claimed is:

1. An electronic module (1), comprising:
a first electronic submodule (2);
at least one further electronic submodule (3, 4);

an electrical conductor (5, 6) that electrically conductively connects the first electronic submodule (2) and the at least one further electronic submodule (3, 4), the electrical conductor (5, 6) reversibly deformable at least in sections; and a casing (15) that encases the first electronic submodule (2), the at least one further electronic submodule (3, 4), and the electrical conductor (5, 6) in a fluid-tight manner, the casing (15) reversibly deformable at least in sections, wherein the casing (15) comprises at least one mechanical module holding fixture (16, 17), wherein the electronic module (1) is reversibly deformable at the electrical conductor (5, 6) between a mounting shape and an operating shape, the at least one mechanical module holding fixture (16, 17) accessible in the mounting shape such that a respective mechanical module (18, 19) is mountable on each of the at least one mechanical module holding fixture (16, 17).

2. The electronic module (1) of claim 1, wherein the casing (15) is one or both of oil-tight and oil-resistant.

3. The electronic module (1) of claim 1, wherein the casing (15) is, at least in sections, one or both of inductively transparent and magnetically transparent.

4. The electronic module (1) of claim 1, wherein the casing (15) is a housing, a casting, or a coating.

5. The electronic module (1) of claim 1, wherein one or more of the first electronic submodule (2) and the at least one further electronic submodule (3, 4) comprises one or more of:

at least one electronic component;

at least one ferrite core (13);

at least one sensor; and at least one printed circuit plate.

6. The electronic module (1) of claim 1, wherein the electrical conductor (5, 6) comprises at least one lead, at least one cable, at least one foil, and/or at least one stamped grid.

7. An actuator device (25), comprising the electronic module (1) of claim 1 and at least one mechanical module (18, 19), each of the at least one mechanical module (18, 19) mounted at a respective one of the at least one mechanical module holding fixture (16, 17).

8. The actuator device (25) of claim 7, wherein the at least one mechanical module (18, 19) comprises a rotor (20) of an electric machine.

9. The actuator device (25) of claim 7, further comprising a load-bearing housing (32).

10. A method for manufacturing the actuator device (25) of claim 7, comprising:

when the electronic module (1) is in the mounting shape at the electrical conductor (5, 6), mounting each of the at least one mechanical module (18, 19) on a respective one of the first electronic submodule (2) and the at least one further electronic submodule (3, 4); and then deforming the electronic module (1) at the electrical conductor (5, 6) into the operating shape.

11. The method of claim 10, further comprising positioning the electronic module (1), including the at least one mechanical module (18, 19), in a load-bearing housing (32).

12. The electronic module (1) of claim 1, wherein the electrical conductor (5, 6) is aligned along a straight line in the in the operating shape.

* * * * *